United States Patent
Koike et al.

(10) Patent No.: US 9,941,420 B2
(45) Date of Patent: Apr. 10, 2018

(54) CONDUCTIVE PASTE, METHOD FOR FORMING WIRING, ELECTRONIC COMPONENT, AND SILICON SOLAR CELL

(71) Applicant: Material Concept, Inc., Sendai-shi, Miyagi (JP)

(72) Inventors: Junichi Koike, Sendai (JP); Hoang Tri Hai, Sendai (JP)

(73) Assignee: MATERIAL CONCEPT, INC., Miyagi (JP)

( * ) Notice: Subject to any disclaimer, the term of this patent is extended or adjusted under 35 U.S.C. 154(b) by 84 days.

(21) Appl. No.: 14/402,006

(22) PCT Filed: May 8, 2013

(86) PCT No.: PCT/JP2013/063472
§ 371 (c)(1),
(2) Date: Nov. 18, 2014

(87) PCT Pub. No.: WO2013/172362
PCT Pub. Date: Nov. 21, 2013

(65) Prior Publication Data
US 2015/0136219 A1    May 21, 2015

(30) Foreign Application Priority Data

May 18, 2012 (JP) ................. 2012-114411
Dec. 26, 2012 (JP) ................. 2012-282065

(51) Int. Cl.
*H01L 31/00* (2006.01)
*H01L 31/02* (2006.01)
(Continued)

(52) U.S. Cl.
CPC ...... *H01L 31/02013* (2013.01); *B22F 1/0011* (2013.01); *B22F 1/0059* (2013.01);
(Continued)

(58) Field of Classification Search
CPC ...... H01L 31/022425; H01L 31/02013; H01B 1/22
(Continued)

(56) References Cited

U.S. PATENT DOCUMENTS 6,379,745 B1    4/2002 Kydd et al.
2006/0210705 A1    9/2006 Itoh et al.
(Continued)

FOREIGN PATENT DOCUMENTS

EP    0564652 A1    5/1992
EP    2416356 A1    2/2012
(Continued)

OTHER PUBLICATIONS

English Translation of Nakahara et al., JP2002-343135.*
(Continued)

*Primary Examiner* — Jeffrey T Barton
*Assistant Examiner* — Niki Bakhtiari
(74) *Attorney, Agent, or Firm* — Cantor Colburn LLP

(57) ABSTRACT

This conductive paste is such that the printing properties and sintering properties are superior and is formed such that resistance of wiring after sintering is lowered. This conductive paste is characterized by being formed from copper-based metal particles and by an aspect ratio (dmax/dmin), which is defined as the ratio of the maximum diameter (dmax) and minimum diameter (dmin) for the metal particles, being greater than or equal to 1.0 and smaller than 2.2.

9 Claims, 2 Drawing Sheets

(51) Int. Cl.
    *C22C 9/00*            (2006.01)
    *H01B 1/22*            (2006.01)
    *H01L 31/0224*       (2006.01)
    *B22F 1/00*            (2006.01)
    *H05K 1/09*            (2006.01)
    *H01B 1/02*            (2006.01)
    *H05K 3/12*            (2006.01)
    *C22C 1/04*            (2006.01)

(52) U.S. Cl.
    CPC ............ *C22C 9/00* (2013.01); *H01B 1/026* (2013.01); *H01B 1/22* (2013.01); *H01L 31/022425* (2013.01); *H05K 1/092* (2013.01); *H05K 3/1291* (2013.01); *C22C 1/0425* (2013.01); *H05K 2201/0245* (2013.01); *H05K 2201/0248* (2013.01); *H05K 2201/0266* (2013.01); *H05K 2203/1131* (2013.01); *Y02E 10/50* (2013.01); *Y10T 428/2982* (2015.01)

(58) Field of Classification Search
    USPC .................................................. 136/243–265
    See application file for complete search history.

(56) References Cited

U.S. PATENT DOCUMENTS

| | | |
|---|---|---|
| 2007/0074391 A1 | 4/2007 | Totokawa et al. |
| 2010/0096014 A1 | 4/2010 | Iida et al. |
| 2011/0095239 A1 | 4/2011 | Ota et al. |
| 2012/0119153 A1* | 5/2012 | Choi ............... H01B 1/22 |
| | | 252/500 |

FOREIGN PATENT DOCUMENTS

| | | |
|---|---|---|
| JP | H03224288 A | 10/1991 |
| JP | 2001515645 A | 9/2001 |
| JP | 2002343135 A | 11/2002 |
| JP | 2003277170 A | 10/2003 |
| JP | 2004027246 A | 1/2004 |
| JP | 2004204290 A | 7/2004 |
| JP | 2004217959 A | 8/2004 |
| JP | 3690552 B2 | 8/2005 |
| JP | 2006073280 A | 3/2006 |
| JP | 2007053212 A | 3/2007 |
| JP | 2008130301 A | 6/2008 |
| JP | 2008226727 A | 9/2008 |
| JP | 2009079269 A | 4/2009 |
| JP | 2009146890 A | 7/2009 |
| JP | 04396134 B2 | 10/2009 |
| JP | 2010013726 A | 1/2010 |
| JP | 2010161331 A | 7/2010 |
| JP | 2011026631 A | 2/2011 |
| JP | 2011044509 A | 3/2011 |
| JP | 2011094236 A | 5/2011 |
| JP | 2011171274 A | 9/2011 |
| JP | 2012067327 A | 4/2012 |
| WO | 2004103043 A1 | 11/2004 |
| WO | 2011145378 A1 | 11/2011 |

OTHER PUBLICATIONS

English Translation of Oda et al., JP2012-067327.*
Extended European search report for European Application No. 13790886.9; dated Apr. 25, 2016.
International Search Report for International Patent Application No. PCT/JP2013/063472; dated Aug. 6, 2013 with English translation.
European Office Action for corresponding Application No. 13790886.9-1373; dated Nov. 6, 2017.

* cited by examiner

CONDUCTIVE PASTE, METHOD FOR FORMING WIRING, ELECTRONIC COMPONENT, AND SILICON SOLAR CELL

This is the U.S. national stage of application No. PCT/JP2013/063472, filed on May 8, 2013. Priority under 35 U.S.C. § 119(a) and 35 U.S.C. § 365(b) is claimed from Japanese Application No. 2012-114411, filed May 18, 2012 and Japanese Application No. 2012-282065, filed Dec. 26, 2012, the disclosures of both are also incorporated herein by reference.

TECHNICAL FIELD

The present invention relates to an electrically conductive paste comprising copper-based metal particles and a method of forming wiring using the electrically conductive paste, and also relates to an electronic component and a silicon solar cell manufactured using the electrically conductive paste.

BACKGROUND ART

An electrically conductive paste is used to form wiring on an electronic component such as a chip resistor, a chip capacitor, a solar cell; and a mounted electronic component such as a printed-circuit board and a substrate having a through hole. Further, it may be used for an electrode and wiring connected to a transistor which controls pixel switching in a display. Many of the current electrically conductive pastes, in which a silver paste having good oxidation resistance is used, have the following problems: silver is expensive; and, in addition, a migration defect may easily be formed in fine pitch wiring. Therefore, attempts have been made for obtaining a low resistance and reliable wiring structure by printing and baking copper paste in which copper is substituted for silver.

For example, Patent Literature 1 discloses an electrically conductive copper paste comprising a thermosetting resin, an organic carboxylic acid compound and a chelating agent as essential ingredients, and having a mean particle diameter of copper particles of 7.0 µm to 9.0 µm.

Patent Literature 2 discloses an electrically conductive copper paste comprising copper particles, a metal salt, polyols, an epoxy resin and imidazole as essential ingredients.

Patent Literature 3 discloses an electrically conductive copper paste having a mean particle diameter of copper particles of 0.1 µm to 1.0 µm, in which a SiO2 gel coating with a thickness of 100 nm or less is applied on the surface of a copper particle.

Patent Literature 4 discloses an electrically conductive copper paste having a particle diameter of copper particles of less than 0.5 µm, in which the surface of a particle is protected from oxidation with dibutylhydroxytoluene.

Patent Literature 5 discloses an electrically conductive copper paste in which 0.1 atomic percent to 10 atomic percent of silicon is contained inside copper particles.

Patent Literature 6 discloses an electrically conductive copper paste in which copper particles contain aluminum.

Patent Literature 7 discloses an electrically conductive copper paste in which copper particles contain bismuth and magnesium.

Patent Literature 8 discloses an electrically conductive copper paste comprising copper flakes having a mean flake diameter of 0.1 nm to 0.3 nm and silver particles having a mean particle diameter of 1 nm to 100 nm.

Patent Literature 9 discloses a copper powder in which a copper oxide is formed on the surface of a copper particle.

Patent Literature 10 discloses an electrically conductive copper paste comprising copper particles containing phosphorus or copper particles having a surface coated with silver, and comprising flux, glass particles.

Patent Literature 11 discloses an electrically conductive copper paste comprising a thermosetting resin, salicyl alcohol, lead, a lead compound, bismuth and a bismuth compound in addition to copper particles.

However, the above conventional electrically conductive copper pastes were composed of metal particles having a flat flake-like shape and those having a sharp needle-like shape. Because of this, a clog may occur when performing screen printing, which leads to the decrease in metal particle density in wiring and may cause spreading of a wiring pattern after baking. Further, an increased void volume may cause poor sintering property, resulting in the increase in wiring resistance after baking.

Moreover, when performing air baking of conventional silver pastes, binder resin reacts with air, and the amount of residual resin in wiring after baking can be reduced as much as possible. Thereby the increase in wiring resistance due to a residual resin can be minimized. In contrast, an electrically conductive copper paste needs to be baked in an inert gas or in vacuum because copper is susceptible to oxidation under an oxygen-containing atmosphere. In this case, a problem may arise, i.e., a binder resin component may remain in wiring due to insufficient oxygen, resulting in poor sintering property and increased wiring resistance.

Even if an electrically conductive copper paste is baked in an inert gas or in vacuum, oxidation of copper particles is difficult to avoid, resulting in increased wiring resistance.

Patent Document 1: Japanese Unexamined Patent Application, Publication No. 2008-130301
Patent Document 2: Japanese Unexamined Patent Application, Publication No. 2008-226727
Patent Document 3: Japanese Unexamined Patent Application, Publication No. 2009-79269
Patent Document 4: Japanese Unexamined Patent Application, Publication No. 2009-146890
Patent Document 5: Japanese Unexamined Patent Application, Publication No. 2010-13726
Patent Document 6: Japanese Unexamined Patent Application, Publication No. 2010-161331
Patent Document 7: Japanese Unexamined Patent Application, Publication No. 2011-26631
Patent Document 8: Japanese Unexamined Patent Application, Publication No. 2011-44509
Patent Document 9: Japanese Unexamined Patent Application, Publication No. 2011-94236
Patent Document 10: Japanese Unexamined Patent Application, Publication No. 2011-171274
Patent Document 11: Japanese Patent No. 4396134

DISCLOSURE OF THE INVENTION

Problems to be Solved by the Invention

The present invention is made in view of these situations. An object of the present invention is to provide an electrically conductive paste having excellent printing and sintering property and being capable of reducing resistance in wiring after baking; a method of forming wiring using the electrically conductive paste; and an electronic component and silicon solar cell manufactured using the electrically conductive paste.

Means for Solving the Problems

To achieve the above objects, (1) a first embodiment of the present invention is an electrically conductive paste comprising copper-based metal particles, wherein the mean value of aspect ratio (dmax/dmin) defined as the ratio of the maximum diameter (dmax) to the minimum diameter (dmin) of a metal particle is equal to or larger than 1.0 and smaller than 2.2.

(2) A second embodiment of the present invention is the electrically conductive paste according to the above item (1), wherein the 90% particle diameter of the above metal particles is more than 0.3 μm and less than 7.0 μm.

(3) A third embodiment of the present invention is the electrically conductive paste according to the above item (2), wherein the 50% particle diameter of the above metal particles is more than 0.1 μm and less than 3.4 μm.

(4) A fourth embodiment of the present invention is the electrically conductive paste according to any one of the above items (1) to (3), wherein the concentration of oxygen contained in the above metal particles is 0.05 mass % or more and 2.0 mass % or less.

(5) A fifth embodiment of the present invention is the electrically conductive paste according to any one of the above items (1) to (4), wherein the total concentration of metal elements other than copper contained in the above metal particles is 1.0 mass % or less of the total metal particles.

(6) A sixth embodiment of the present invention is the electrically conductive paste according to the above item (5), wherein the total concentration of elements having a standard Gibbs free energy of formation of oxides less than that of iron among metal elements other than copper contained in the above metal particles is 0.5 mass % or less of the total metal particles.

(7) A seventh embodiment of the present invention is the electrically conductive paste according to the above item (5) or (6), wherein the total concentration of elements having a solid solubility limit of 0.1 mass % or less in copper at room temperature among metal elements other than copper contained in the above metal particles is 0.5 mass % or less of the total metal particles.

(8) An eighth embodiment of the present invention is the above electrically conductive paste according to any one of the above items (1) to (7), wherein the mass % of a binder resin in an organic vehicle contained in the electrically conductive paste is more than 0.05% and less than 17.0%.

(9) A ninth embodiment of the present invention is the electrically conductive paste according to any one of the above items (1) to (8), wherein the mass % of an organic vehicle contained in the above electrically conductive paste is more than 3.0% and less than 19.0%.

(10) A tenth embodiment of the present invention is a method of forming wiring, comprising printing an electrically conductive paste on a substrate and performing baking, wherein the electrically conductive paste according to any one of the above items (1) to (9) is used as the above electrically conductive paste, and the above baking is performed under a baking atmosphere of an inert gas or vacuum and under an oxygen partial pressure of 10-3 Pa or less in the baking atmosphere.

(11) An eleventh embodiment of the present invention is a method of forming wiring, comprising printing an electrically conductive paste on a substrate and performing baking, wherein the above electrically conductive paste according to any one of the above items (1) to (9) is used as the electrically conductive paste, and the above baking is performed under a baking atmosphere of an inert gas or vacuum and under a pressure ratio (CO/CO2) of carbon monoxide to carbon dioxide of 10-8 or more in the baking atmosphere.

(12) A twelfth embodiment of the present invention is the method of forming wiring according to any one of the item (10) or (11), wherein the above inert gas is nitrogen gas or argon gas, and contains 3500 ppm or less of oxygen, the inert gas passing through liquid alcohol before introduced into a baking furnace.

(13) A thirteenth embodiment of the present invention is the method of forming wiring according to any one of the items (10) to (12), wherein the above baking is performed at a baking temperature of between 200° C. and 850° C. inclusive for a baking duration of between 1 minute and 60 minutes inclusive.

(14) A fourteenth embodiment of the present invention is the method of forming wiring according to the above item (10) or (11), wherein the baking is performed at a baking temperature of between 300° C. and 500° C. inclusive for a baking duration of between 1 minute and 7 minutes inclusive, and the inert gas is introduced into a baking furnace without passing through liquid alcohol.

(15) A fifteenth embodiment of the present invention is an electronic component manufactured by forming wiring on a substrate using the electrically conductive paste according to any one of the items (1) to (9).

(16) A sixteenth embodiment of the present invention is a silicon solar cell manufactured by forming wiring on a substrate using the electrically conductive paste according to any one of the items (1) to (9).

Effects of the Invention

According to the first embodiment of the present invention, the mean value of aspect ratio (dmax/dmin) defined as the ratio of the maximum diameter (dmax) to the minimum diameter (dmin) of a copper-based metal particle in an electrically conductive paste is equal to or larger than 1.0 and smaller than 2.2. In a case where the mean aspect ratio of the metal particles is more than 2.2, the particles may have an extremely flat flake-like shape or an extremely sharp needle-like shape, resulting in occurrence of a clog during screen printing. Further, a low filling density of the metal particles in wiring after printing may cause the width-spreading of a wiring pattern. In addition, an increased void volume may cause poor sintering property, resulting in increased wiring resistance after baking. Meanwhile, when the mean aspect ratio is equal to or larger than 1.0 and smaller than 2.2, such a Cu-based conductive paste can avoid the paste clogging upon printing as well as minimizing the width-spread of a wiring pattern after printing. The improvement of the sintering property between particles after baking enables to provide low resistance wiring having an excellent shape of the wiring pattern.

According to the second embodiment of the present invention, the 90% particle diameter of the metal particles is more than 0.3 μm and less than 7.0 μm. When forming a wiring pattern with the electrically conductive paste by screen printing, a 90% particle diameter of 7.0 μm or more may cause occurrence of a clog during screen printing. For this reason, a 90% particle diameter is preferred to be small. However, a majority of particles manufactured by the water atomizing method and the like are to be sieved and discarded in order to obtain particles having a size of less than 0.3 µm. Therefore, the cost of metal particles to be used as a raw material of an electrically conductive paste will become unnecessarily high. Therefore, a 90% particle diameter of more than 0.3 µm and less than 7.0 µm can provide an electrically conductive paste which does not cause a clog during printing, but without resulting in an unnecessarily high material cost.

According to the third embodiment of the present invention, the 50% particle diameter of the metal particles is more than 0.1 µm and less than 3.4 µm. A 50% particle diameter of less than 3.4 µm enables to obtain a viscosity required for an electrically conductive paste (150 to 350 Pa·s) when kneading with an organic vehicle even in a case where the content rate of a binder resin is lower than that in the conventional electrically conductive paste. Therefore, when baked under an inert gas or under vacuum, the amount of residual carbon from a binder resin component can be reduced, and a low resistance wiring having excellent sintering property can be formed. In a case where the 50% particle diameter is more than 3.4 µm, the content of a binding resin needs to be increased in order to maintain the optimal viscosity, and carbon may remain after baking. This can interfere with obtaining low resistance wiring. Further, in a case where the particle diameter becomes less than 0.1 µm, not only the material cost becomes unnecessarily high, but the relative amount of copper oxides on particle surfaces relative to the total particle volume is increased. Therefore, the sintering property will be deteriorated due to the presence of residual oxygen, resulting in increased wiring resistance.

According to the fourth embodiment of the present invention, the concentration of oxygen contained in the metal particles is between 0.05 mass % and 2.0 mass % inclusive. As a consequence, improved printing property, reduced wiring resistance and reduced cost can be achieved. An oxygen concentration of more than 2.0 mass % is not preferred because the degree of oxidation of the metal particles is significant, and a tendency for aggregating in an electrically conductive paste becomes strong, resulting in decreased printing property. Further, it is not preferred because oxidized metal will not be sufficiently reduced even by subsequent baking, resulting in increased wiring resistance after baking. Therefore, the concentration of oxygen inevitably contained is preferably as low as possible. However, in order to achieve an oxygen concentration of less than 0.05 mass % in the metal particles manufactured by the atomizing method and the like, processing under a reducing gas is required. This is not preferred due to increased cost.

According to the fifth embodiment of the present invention, the total concentration of metal elements other than copper contained in the metal particles is 1.0 mass % or less. In general, metal impurities contained in a raw material are carried over into metal particles when manufactured by the atomizing method and the like. It is well known that impurities contained in metal particles are not preferred because they cause increase in electric resistance. However, in the case of an electrically conductive paste, the presence of void in wiring after baking makes a more significant impact on increase in resistance. Therefore, the effects of the presence of impurities on increased resistance are relatively insignificant, and acceptable up to 10 times of bulk resistance. According to the present invention, the total concentration of metal elements other than copper as the above impurities is 1.0 mass % or less. As a consequence, increased resistance due to impurities can be limited within the acceptable range.

According to the sixth embodiment of the present invention, the total concentration of elements having a standard Gibbs free energy of formation of oxides less than that of iron among metal elements other than copper contained in the metal particles is 0.5 mass % of the total metal particles. The standard Gibbs free energy of formation of oxides ($\Delta G°$) for a metal element can be illustrated in the Ellingham diagram. The smaller $\Delta G°$ is, the stronger a tendency for forming oxides becomes. Elements having a $\Delta G°$ smaller than that of iron are manganese (Mn), silicon (Si), boron (B), titanium (Ti), cerium (Ce), aluminum (Al), magnesium (Mg), calcium (Ca). These elements will be oxidized in a process of manufacturing particles, in a process of manufacturing an electrically conductive paste and in a process of baking the electrically conductive paste to be deposited as oxide particles on the surfaces of and inside the metal particles. As a result, resistance of particles themselves will be increased, and in addition, sintering property between particles during baking will be decreased, resulting in increased wiring resistance. Therefore, the effects of oxides may become negligible when the total amount of these elements contained in copper-based metal particles is 0.5 mass % or less.

According to the seventh embodiment of the present invention, the total concentration of metal particles having a solid solution limit of 0.1 mass % or less in copper at room temperature among metal elements other than copper contained in the metal particles is 0.5 mass % or less of the total metal particles. Elements satisfying this condition are silver (Ag), bismuth (Bi), cobalt (Co), chromium (Cr), iron (Fe), molybdenum (Mo), niobium (Nb), lead (Pb), ruthenium (Ru), tantalum (Ta), tungsten (W), vanadium (V). They show a tendency for segregating on the surface and the grain boundary of copper particles since the solid solubility limit is small. Once surface segregation occurs, sintering property during baking is degraded, and in addition, the electric resistance at sintering interface is increased. Further, once grain boundary segregation occurs, the grain boundary scattering effect of electrons will become large, resulting in increased wiring resistance. Therefore, the adverse effects of segregation may become negligible when the total amount of these elements contained in copper-based metal particles is 0.5 mass % or less.

According to the eighth embodiment of the present invention, the mass % of a binder resin in an organic vehicle contained in an electrically conductive paste is more than 0.05% and less than 17.0%. When performing air baking as in a conventional silver paste, the amount of a resin remaining in wiring after baking can be reduced as much as possible by allowing a binder resin to react with air to control increase in wiring resistance due to a residual resin. In contrast, since an electrically conductive paste comprising copper particles is baked under an inert gas or under vacuum, a binder resin component remains in wiring, resulting in poor sintering property and increased wiring resistance. Therefore, when the mass % of a binder resin in an organic vehicle is less than 17.0%, the effects of a binder resin component remaining in wiring after baking on wiring resistance may become negligible. On the other hand, when the mass % of a binder resin in an organic vehicle is less than 0.05%, the viscosity of an electrically conductive paste becomes small, resulting in poor printing property. Therefore, more than 0.05% and less than 17.0% are preferred.

According to the ninth embodiment of the present invention, the mass % of an organic vehicle contained in an electrically conductive paste is more than 3.0% and less than 19.0%. Therefore, a wiring pattern can be maintained in good conditions. An organic vehicle is a liquid in which a binder resin, a solvent and other organic substances added if desired are all mixed. A mass % of an organic vehicle of 19.0% or more is not preferred because paste spread may occur in a printed wiring pattern due to a reduced viscosity of an electrically conductive paste. On the other hand, a mass % of an organic vehicle of less than 3.0% is not preferred because a uniform pattern of wiring cannot be formed due to an excessively increased viscosity of an electrically conductive paste.

According to the tenth embodiment of the present invention, when printing the electrically conductive paste according to the present invention on a substrate, performing baking and forming wiring, the baking is performed under a baking atmosphere of an inert gas or vacuum and under a condition where the oxygen partial pressure is $10^{-3}$ Pa or less in the baking atmosphere. The term vacuum as used herein refers to a condition where the pressure is $10^{-2}$ Pa or less. When the oxygen partial pressure is more than $10^{-3}$ Pa, copper particles are oxidized during baking. On the other hand, the oxidation of copper particles during baking can be prevented when the oxygen partial pressure is $10^{-3}$ Pa or less. Further, by including a trace amount of oxygen at $10^{-3}$ Pa or less causes a reaction with a binder resin to have almost no residual binder resin component remained in wiring. Therefore, the effects of a residual binder resin can be negligible.

According to the eleventh embodiment of the present invention, when printing an electrically conductive paste according to the present invention on a substrate, performing baking and forming wiring, the baking is performed under a baking atmosphere of an inert gas or vacuum and under a condition where the pressure ratio ($CO/CO_2$) of carbon monoxide to carbon dioxide in the baking atmosphere is $10^{-8}$ or more. The term vacuum as used herein refers to a condition where the pressure is $10^{-2}$ Pa or less. When ($CO/CO_2$) is less than $10^{-8}$, copper particles are oxidized during baking. On the other hand, when ($CO/CO_2$) is $10^{-8}$ or more, the reducing effects of CO can prevent the oxidation of copper particles during baking. Even if some of copper particles before baking are oxidized, copper oxides will be reduced into copper, and good sintering property can be achieved.

According to the twelfth embodiment of the present invention, the inert gas is nitrogen gas or argon gas, and contains 3500 ppm or less of oxygen, the inert gas passing through liquid alcohol before introduced into a baking furnace. This can allow alcohol molecules and oxygen to decompose and eliminate a binder resin in a baking furnace, and in addition, can reduce copper oxides inevitably formed on the surface of a copper particle. Therefore, copper particles can be sintered as low as at 200° C. to obtain low resistance wiring. Note that a hydrogen gas atmosphere, which has an effect of reducing copper oxides, could be used for a baking atmosphere, but it is not preferred because the decomposition and elimination of a binder resin component cannot be achieved.

According to the thirteenth embodiment of the present invention, the baking is performed at a baking temperature of between 200° C. and 850° C. inclusive for a baking duration of between 1 minute and 60 minutes inclusive. As a consequence, sintering property can be maintained, and increased resistance due to oxidation can be prevented in a reliable manner, and further, higher productivity can be maintained. A baking temperature of less than 200° C. is not preferred because good sintering property of copper particles cannot be obtained while a baking temperature of more than 850° C. is not preferred because copper particles are oxidized. Further, in a case where the baking duration is 1 minutes or more, sufficient sintering property can be obtained. A baking duration of more than 60 minutes is not preferred because productivity is decreased.

According to the fourteenth embodiment of the present invention, the baking is performed at a baking temperature of between 300° C. and 500° C. inclusive for a baking duration of between 1 minute and 7 minutes inclusive, and an inert gas is introduced into a baking furnace without passing through liquid alcohol. Even in a case where an inert gas is introduced into a baking furnace without passing through liquid alcohol under given baking conditions, good sintering property can be achieved, and low resistance wiring can be obtained. According to the fifteenth embodiment of the present invention, an electronic component is manufactured using the electrically conductive paste according to the present invention. As a consequence, printing property and sintering property can be improved in the manufacturer process. Therefore, an electronic component with low wiring resistance can be manufactured. Further, because the formation of oxides of the elements on substrate surface can be controlled, an electronic component comprising wiring having excellent adherence with the substrate can be obtained. An electronic component comprising such wiring can suppress a direct-current resistance component for the whole component. Therefore, power saving, high efficiency and high reliability can be achieved.

According to the sixteenth embodiment of the present invention, a silicon solar cell is manufactured using the electrically conductive paste according to the present invention. As a consequence, printing property and sintering property can be improved in the manufacturer process. Therefore, a silicon solar cell with low wiring resistance can be manufactured. Further, because the formation of oxides of the above elements on a substrate interface can be controlled, a silicon solar cell comprising wiring having excellent adherence with a substrate can be obtained. A silicon solar cell comprising such wiring can suppress a direct-current resistance component for the whole component. Therefore, power saving, high efficiency and high reliability can be achieved.

PREFERRED MODE FOR CARRYING OUT THE INVENTION

Figure 1:
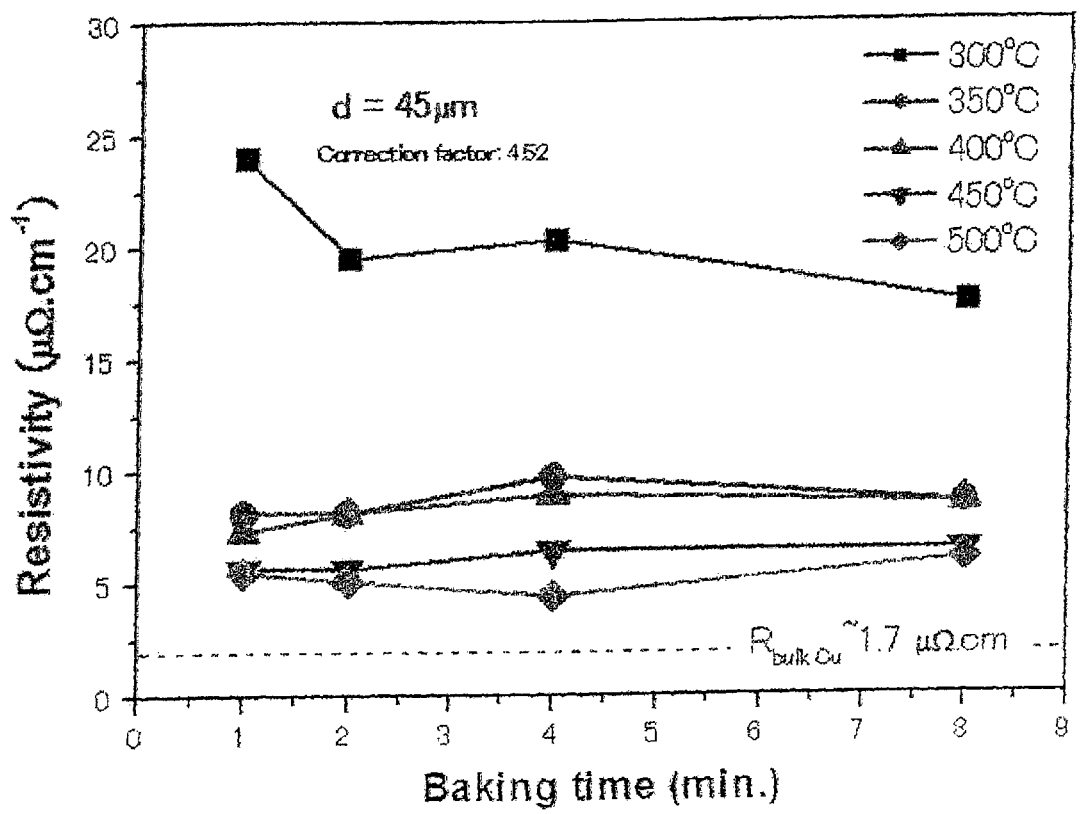
FIG. 1 shows the electric resistivity of wiring manufactured by printing a copper paste on a silicon substrate and baking at various temperatures and for various durations.

Embodiments of the prevent invention will be described below in detail.

(Metal Particle)

Metal particles contained in the electrically conductive paste according to the present invention are preferably spherical particles manufactured by a method such as the gas atomizing method, the water atomizing method or the like. The spherical particles do not need to be perfect spheres. The mean value of aspect ratio (dmax/dmin) defined as the ratio of the maximum diameter (dmax) to the minimum diameter (dmin) of a particle may be equal to or larger than 1.0 and smaller than 2.2, more preferably between 1.0 and 2.0 inclusive.

In a case where the mean aspect ratio of the metal particles is more than 2.2, the particles may have an extremely flat flake-like shape or an extremely sharp needle-like shape, resulting in occurrence of a clog during screen printing. Further, a low filling density of metal particles in wiring after printing may cause in the width-spreading of a wiring pattern. In addition, an increased void volume may cause poor sintering property, resulting in increased wiring resistance after baking.

According to the present invention, the mean aspect ratio is equal to or larger than 1.0 and smaller than 2.2. As a consequence, a clog during printing due to flat particles and needle-like particles can be avoided, and in addition, width spread of a wiring pattern after printing can be reduced. Therefore, sintering property between particles after baking is improved, and low resistance wiring having an excellent wiring pattern can be obtained. When the mean aspect ratio is between 1.0 and 2.0 inclusive, the effect thereof can be reliably obtained.

Note that complete removal of particles having a mean aspect ratio of more than 2.2 is technically difficult. However, those particles having the aspect ratio of more than 2.2 do not make a negative impact on paste properties if their content is less than 5% of the total number of particles.

The range of a sphere equivalent diameter by volumetric basis is more than 0.3 μm and less than 7.0 μm in the 90% particle diameter. When forming a wiring pattern with an electrically conductive paste by screen printing, a 90% particle diameter of 7.0 μm or more may cause occurrence of a clog during screen printing. For this reason, a 90% particle diameter is preferred to be small. However, a majority of particles manufactured by the water atomizing method and the like are to be removed and discarded by sieving in order to give a size of less than 0.3 μm. Therefore, the cost of metal particles used as a raw material of an electrically conductive paste will be unnecessarily high. Therefore, a 90% particle diameter of more than 0.3 μm and less than 7.0 μm can provide an electrically conductive paste which does not cause a clog during printing, but without resulting in an unnecessarily high material cost.

Further, the range of a sphere equivalent diameter by volumetric basis is preferably more than 0.1 μm and less than 3.4 μm in the 50% particle diameter. A 50% particle diameter of less than 3.4 μm can provide a viscosity required for an electrically conductive paste (150 to 350 Pa·s) when kneading with an organic vehicle even in a case where the content rate of a binder resin is lower than that in the conventional electrically conductive pastes. Therefore, when baked under an inert gas or under vacuum, the amount of residual carbon from a binder resin component can be reduced, and a low resistance wiring having excellent sintering property can be formed. In a case where the 50% particle diameter is more than 3.4 μm, the content of a binder resin needs to be increased in order to maintain the optimal viscosity, and carbon may remain after baking. This can interfere with obtaining low resistance wiring. Further, in a case where it is less than 0.1 μm, the material cost is unnecessarily high, and, in addition, the relative amount of copper oxides on particle surfaces relative to the total particle volume is increased. Therefore, sintering property will be deteriorated due to the presence of residual oxygen, resulting in increased wiring resistance.

Particles having a 90% particle diameter of more than 0.3 μm and less than 7.0 μm, and having a 50% particle diameter of more than 0.1 μm and less than 3.4 μm can be obtained by a method such as a screen and an air sieving apparatus. Further, the aspect ratio, particle diameter and particle number ratio of copper particles in an electrically conductive paste can be measured by observing a structure with a scanning electron microscope after drying the paste.

With regard to copper particles contained in an electrically conductive paste, the concentration of oxygen in the particles is between 0.05 mass % and 2.0 mass % inclusive. More preferably, the upper limit of the concentration may be 1.0 mass % or less. The reason for defining the concentration of oxygen in particles as described above is that when the concentration of oxygen is 2.0 mass % or more, the degree of oxidation of metal particles is significant, and a tendency for aggregating in an electrically conductive paste becomes strong, resulting in poor printing property. Another reason is to prevent increase in wiring resistance after baking due to insufficient reduction of metal oxides by subsequent baking. Meanwhile, the concentration of oxygen is preferably low as much as possible. However, in order to achieve a concentration of oxygen of less than 0.05 mass % in metal particles manufactured by the atomizing method and the like, processing under a reducing gas is required, resulting in unfavorably increased cost.

The total concentration of metal elements other than copper contained in particles is controlled at 1.0 mass % or less, more preferably 0.8 mass % or less.

In general, metal impurities contained in a raw material are carried over into metal particles when manufactured by the atomizing method and the like. It is well known that impurities contained in metal particles are not preferred because they cause increase in electric resistance. However, in the case of an electrically conductive paste, the presence of void in wiring after baking makes a more significant impact on increase in resistance. Therefore, the effects of the presence of impurities on increase in resistance are relatively small, and acceptable up to 10 times of bulk resistance. According to the present invention, the total concentration of metal elements other than copper as these impurities is 1.0 mass % or less. As a consequence, increase in resistance due to impurities can be limited within the acceptable range. Among the above metal elements other than copper, the total concentration of elements having a standard Gibbs free energy of formation of oxides smaller than that of iron is 0.5 mass % or less of the total metal particles.

The standard Gibbs free energy of formation of oxides ($\Delta G°$) for a metal element can be illustrated in the Ellingham diagram. The smaller $\Delta G°$ is, the stronger a tendency for forming oxides becomes. Specifically, as a result of comparing values documented in the collection of thermodynamics data and the Ellingham diagram and the like, target elements of which the total concentration is to be controlled are manganese (Mn), silicon (Si), boron (B), titanium (Ti), cerium (Ce), aluminum (Al), magnesium (Mg), calcium (Ca).

These elements will be oxidized as oxide particles on the surfaces of and inside the metal particles during the processes of manufacturing particles, a process of manufacturing an electrically conductive paste and a process of baking the electrically conductive paste. As a result, resistance of particles themselves will be increased, and in addition, sintering property between particles during baking will be degraded, resulting in increased wiring resistance. Therefore, in a case where the total amount of these elements contained in copper-based metal particles is 0.5 mass % or less, the effects thereof may be negligible, and wiring resistance can be controlled to be low even if oxides are formed.

Further, the total concentration of elements having a solid solution limit of 0.1 mass % or less in copper at room temperature among the above metal elements other than copper is also 0.5 mass % or less of the total metal particles. Specifically, as a result of comparing information documented in binary-system phase diagrams, target elements are silver (Ag), bismuth (Bi), cobalt (Co), chromium (Cr), iron (Fe), molybdenum (Mo), niobium (Nb), lead (Pb), ruthenium (Ru), tantalum (Ta), tungsten (W), vanadium (V).

These elements have a tendency for segregating on the surfaces and grain boundaries of copper particles because of their small solid solubility limit. Once surface segregation occurs, sintering property during baking is degraded, and in addition, electric resistance at a sintering interface is increased. Further, once grain boundary segregation occurs, the grain boundary scattering effect of electrons will become large, resulting in increased wiring resistance. Therefore, the adverse effects due to segregation may be negligible, and wiring resistance can be controlled to be low when the total amount of these elements contained in copper-based metal particles is 0.5 mass % or less.

Note that the concentration of oxygen and the concentration of a metal described above can be analyzed using a known analytical method such as high-frequency inductively-coupled plasma spectrometry, fluorescence X-ray spectrometry, X-ray energy dispersive spectrometry.

(Binder Resin)

The mass % of a binder resin in an organic vehicle contained in an electrically conductive paste is to be more than 0.05% and less than 17.0%. The binder resin may be any resin as long as it can be decomposed by the baking method described in the present invention. They include, for example, a cellulosic resin such as methyl cellulose, ethyl cellulose, carboxymethyl cellulose, an acrylic resin, a butyral resin, an alkyd resin, an epoxy resin, a phenol resin and the like. Among these, a cellulose based resin is preferably used which has a tendency for reacting with a trace amount of oxygen or a trace amount of carbon monoxide contained in a baking atmosphere to easily disappear out of a paste. More preferably, among cellulose based resins, ethyl cellulose is used.

When performing air baking as in a conventional silver paste, the amount of a resin remaining in wiring after baking can be reduced as much as possible by allowing a binder resin to react with air to control increase in wiring resistance due to a residual resin. In contrast, since an electrically conductive paste comprising copper particles is baked under an inert gas or under vacuum, a binder resin component remains in wiring, resulting in poor sintering property and increased wiring resistance. In view of this, when the mass % of a binder resin in an organic vehicle is less than 17.0%, the effects of a binder resin component remaining in wiring after baking on wiring resistance may be negligible. On the other hand, when the mass % of a binder resin in an organic vehicle is less than 0.05%, the viscosity of an electrically conductive paste becomes small, resulting in poor printing property. Therefore, according to the present invention, the mass % of a binder resin in an organic vehicle contained in an electrically conductive paste is to be more than 0.05% and less than 17.0%.

(Solvent)

There is no particular limitation for the solvent contained in an electrically conductive paste as long as it has an appropriate boiling point, vapor pressure, viscosity. Solvents include, for example, a hydrocarbon based solvent, a chlorinated hydrocarbon based solvent, a cyclic ether based solvent, an amide based solvent, a sulfoxide based solvent, a ketone based solvent, an alcohol based compound, a solvent based on an ester of a polyhydric alcohol, a solvent based on an ether of a polyhydric alcohol, a terpene based solvent and a mixture of thereof. Among these, Texanol, butylcarbitol, butylcarbitol acetate, terpineol, which have a boiling point of about 200° C., are preferably used.

(Other Components in Organic Vehicle)

An organic vehicle is a liquid in which a binder resin, a solvent and other organic substances added if desired are all mixed. In a case where baking is performed in an atmosphere described in the present invention, it is enough to use an organic vehicle prepared by mixing a binder resin with a solvent, but a metal salt and a polyol may be mixed if desired. Examples of a metal salt include copper acetate (II), copper benzoate (II), bis(acetylacetonato) copper (II). Further, examples of a polyol include ethylene glycol, diethylene glycol, trimethylene glycol, propylene glycol, tetraethylene glycol. By adding these, a polyol reduces a metal salt during baking to deposit a reduced metal at the void between particles, leading to an effect of improving electrical conductivity between particles.

The mass % of the above organic vehicle contained in an electrically conductive paste is more than 3.0% and less than 19.0%. More preferably, it may be between 8.0% and 15.0% inclusive.

A wiring pattern may well be maintained when the mass % of an organic vehicle contained in an electrically conductive paste is more than 3.0% and less than 19.0%. A mass % of an organic vehicle of 19.0% or more is not preferred because paste spread may occur in a printed wiring pattern due to a reduced viscosity of an electrically conductive paste. On the other hand, a mass % of an organic vehicle of less than 3.0% is not preferred because a uniform pattern of wiring cannot be formed due to an excessively increased viscosity of an electrically conductive paste.

(Production of Electrically Conductive Paste)

An electrically conductive paste may be produced by mixing a binder resin with a solvent, further adding copper particles, and kneading using a device such as a planetary mixer. Further, glass frit may be added in an amount of 10% or less by the mass ratio relative to the mass of copper particles. Furthermore, an approach for improving dispersibility of particles with a 3-roll mill may be taken if desired.

(Method of Forming Wiring)

The electrically conductive paste described above is printed on a substrate using a method such as the screen printing method to produce a wiring pattern. Subsequently, baking is performed in an inert gas or a vacuum atmosphere, and metal particles are sintered to give wiring. The term vacuum as used herein refers to a condition where the pressure is $10^{-2}$ Pa or less.

Oxygen at a partial pressure of $10^{-3}$ Pa or less is to be present in a baking atmosphere. When the partial pressure of oxygen is more than $10^{-3}$ Pa, copper particles are oxidized during baking. On the other hand, the oxidation of copper particles during baking can be prevented when the partial pressure of oxygen is $10^{-3}$ Pa or less. Further, including a trace amount of oxygen at $10^{-3}$ Pa or less causes a reaction with a binder resin to have almost no binder resin component remained in wiring. Therefore, the effects of a residual binder resin can be negligible.

Further, according to the present invention, baking may be performed under a condition where the $CO/CO_2$ pressure ratio is $10^{-8}$ or more in a baking atmosphere. When (CO/

$CO_2$) is less than $10^{-8}$, copper particles are oxidized during baking. On the other hand, when ($CO/CO_2$) is $10^{-8}$ or more, the reducing effects thereof can reliably prevent the oxidation of copper particles during baking. Even if some of copper particles before baking are oxidized, copper oxides will be reduced into copper, and good sintering property can be obtained.

As described above, according to the present invention, the partial pressure of oxygen is $10^{-3}$ Pa or less, or the $CO/CO_2$ pressure ratio is $10^{-8}$ or more under a baking atmosphere of an inert gas or vacuum. Further, even better sintering property can be achieved by employing a nitrogen gas containing 3500 ppm or less of oxygen as an inert gas, and allowing the nitrogen gas to pass through liquid alcohol before introduced into a baking furnace. That is, by allowing the nitrogen gas to pass through liquid alcohol, alcohol molecules and oxygen can decompose and eliminate a binder resin in a baking furnace, and in addition, can reduce copper oxides inevitably formed on the surfaces of copper particles. Therefore, sintering of copper particles can be achieved as low as at 200° C., and low resistance wiring can be obtained. Note that a hydrogen gas atmosphere, which has an effect of reducing copper oxides, could be used for a baking atmosphere, but it is not preferred because the decomposition and elimination of a binder resin component cannot be achieved.

Note that a nitrogen gas is used as an inert gas in the above description, but an argon gas containing 3500 ppm or less of oxygen may be used.

(Electronic Components)

Using the aforementioned method of forming wiring, metal wiring is formed on a substrate comprising any one of insulating ceramics, electrically conductive ceramics, semiconductors to give an electronic component. An insulating ceramics substrate is used for a resistor, a capacitor and the like. An electrically conductive ceramics substrate is used for a surface electrode of a touch panel, a solar cell and the like. A semiconductor substrate is used for a pixel transistor of a flat display, a solar cell and the like. When the electrically conductive paste according to the present invention is used on these substrates to manufacture electronic components, printing property and sintering property can be improved in the manufacturing process. Therefore, electronic components with low wiring resistance can be obtained. Further, an electronic component having such wiring can suppress series resistance for the whole component. Therefore, an electronic component characterized by power saving, high efficiency, high performance and high reliability can be obtained.

Further, when the total concentration of metal elements other than copper contained in wiring is 1.0 mass % or less, increase in wiring resistance can be prevented. In particular, when the total concentration of elements having a standard Gibbs free energy of formation of oxides smaller than that of iron among metal elements other than copper is 0.5 mass % or less of the total metal particles, the formation of high resistance oxides in wiring can be prevented. Therefore, low resistance wiring can be obtained. Further, because the formation of oxides of the above elements on a substrate interface can be prevented, reliable wiring having excellent adherence with a substrate can be obtained.

Further, when the total concentration of metal elements other than copper contained in wiring is 1.0 mass % or less, and elements having a solid solbility limit of 0.1 mass % or less in copper at room temperature among the metal elements other than copper is 0.5 mass % or less of the total metal particles, a surface which makes contact with the grain boundary and the void in wiring obtained by baking, and segregation of the above elements on an interface with a substrate, and the presence of oxides of these elements can be controlled. Therefore, low resistance wiring can be obtained, and in addition, reliable wiring having excellent adherence with a substrate can be obtained.

When the copper electronic paste according to the present invention is used in an insulating ceramics substrate used for a resistor, a capacitor and the like as described above, an inexpensive electronic component with excellent reliability can be provided.

Electrically conductive ceramics substrates include those in which an indium tin oxide (ITO) and the like are deposited on a glass plate surface. They may be used as an electronic component such as a touch panel. For a touch panel, metal wiring is used in a frame electrode. Using the electrically conductive paste according to the present invention enables a high-speed response of the touch panel. And reducing a frame area enables to have a large screen size.

In addition to ITO, electrically conductive ceramics substrates include tin oxides, zinc oxides and those obtained by adding other metals which are different in valence to these oxides. They are used in a transparent surface electrode for efficiently collecting electrons generated in a solar cell. By forming wiring on these electrically conductive ceramics substrates using the electrically conductive paste according to the present invention, the adherence at the interface between a substrate and wiring can be improved and interface contact resistance can be decreased as well as a solar cell having large release current, excellent power generation efficiency and excellent migration resistance can be provided.

Semiconductor substrates include indium gallium zinc oxide (IGZO) which is used for pixel switching in a large display. By forming gate, source, drain electrodes and wiring on an IGZO semiconductor using the copper paste according to the present invention, an inexpensive display can be provided which has electrodes and wiring having similar property as compared with those manufactured by a conventional method of forming wiring such as vacuum deposition, lithography, etching.

Other semiconductor substrates include a materials used for an emitter of solar cell such as silicon. A metal paste is used for a current collection electrode on a front side and back side of a photoreceptor. By using the copper paste according to the present invention for the current collecting electrode, the adherence at the interface between a substrate and wiring can be improved and interface contact resistance can be decreased as well as a solar cell having large release current, excellent power generation efficiency and excellent migration resistance can be provided.

EXAMPLE 1

The present invention will be further described below in detail with reference to Examples, but the present invention shall not be limited to these Examples.

A copper paste was produced as follows.

Copper particles formed by a high-pressure water atomizing method were used. The 10% diameter of the copper particles was 0.7 μm, and the 50% diameter was 1.3 μm, and the 90% diameter was 2.2 μm. Further, the mean aspect ratio of the copper particles was 1.2. The composition of the copper particles as measured by X-ray fluorescence analysis was as follows: the concentration of copper was 99.8 mass %, and the total concentration of zinc (Zn), tin (Sn), iron (Fe), beryllium (Be), nickel (Ni), manganese (Mn) was 0.2 mass %.

Next, in order to prepare an organic vehicle, ethyl cellulose and Texanol were weighed out to give a mass % of 5% and 95% in the organic vehicle, respectively, and mixed and stirred in a glass vessel. The organic vehicle prepared in this way and copper particles were weighed out to give a mass % of 12% and 88%, respectively, and kneaded with a planetary mixer to obtain a copper paste.

This copper paste was printed into a wiring pattern using an automatic screen printer.

A substrate used was a single-crystal silicon wafer in which texture had been formed on a surface by an alkaline etching method, and the shape thereof was a square having a side length of 125 mm. A mask used for printing was made from stainless steel, and had parallel openings with an opening line width of 70 μm and a line interval of 3 mm.

When wiring formed by printing was observed by sight and by an optical microscope after drying at room temperature, the width and pattern of the wiring were found to be uniform, and neither disconnection nor protrusion was observed. Further, when the substrate was snapped to observe a cross section of the wiring, the thickness of the wiring was found to be 23 μm, and the length of the base line of the wiring being in contact with the substrate was found to be 73 μm. In the case of a silver paste printed under the same conditions, the length of the base line was 99 μm. Therefore, in the case of the developed copper paste herein, expanding a length of base line due to the width-spread of a paste is reduced, and the shadow loss when used for a solar cell can be reduced. Further, even in a case where the opening line width of the mask was changed to 60 μm, 50 μm, 40 μm, 30 μm, wiring having a uniform width and cross-sectional shape was able to be printed. In any cases, the length of the base line of wirings was in the range of between 1.01 and 1.65 times inclusive of the opening line width of the mask. Further, the aspect ratio of a cross section of wiring obtained by dividing the thickness of wiring by the length of the base line of wiring was between 0.18 and 0.35 inclusive.

As described above, according to the present invention, a copper paste expressing good printing property was able to be produced. Next, a silicon substrate on which the above copper paste had been printed was placed in a baking furnace, and evacuation of air was performed until the pressure in the furnace reached 10-2 Pa or less. Then, heating was performed for 5 minutes at 150° C. to dry the paste. Subsequently, the temperature in the furnace was increased to various temperatures ranging from 300° C. to 500° C., and a nitrogen gas containing 1000 ppm of oxygen was introduced into the furnace after allowed to pass through ethyl alcohol, and then baking was performed for 1 minute to 10 minutes. FIG. 1 shows a dependency of the baking temperature and baking duration of the electric resistivity of wiring on a silicon substrate as described above. The resistivity of wiring is about 20 μΩcm in a case where the baking temperature is 300° C. while the resistivity of wiring is 10 μΩcm or less in a case where the baking temperature is 350° C. or more. Further, a significant time dependency of resistivity is not observed when the baking duration is in the range from 1 minute to 10 minutes. This was the case even when the baking duration was 60 minutes.

In the case of the aforementioned baking within the range from 300° C. to 500° C., baking may be performed by directly introducing a nitrogen gas containing 3500 ppm or less of oxygen into a furnace without passing through ethyl alcohol. In this case, copper particles were gradually oxidized by oxygen contained in nitrogen, and therefore the resistivity of wiring was more than 10 μΩcm when the baking duration was 7 minutes or more. This was an undesirable result. Meanwhile, in a case where the baking temperature was 350° C. or more, and the baking duration was 6 minutes or less, a low wiring resistivity of 10 μΩcm or less was able to be obtained.

Further, in a case of the aforementioned baking at the range from 300° C. to 500° C., baking may be performed under the conditions where a nitrogen gas containing 3500 ppm or less of oxygen as well as carbon monoxide gas were introduced, and the pressure ratio (CO/CO2) of carbon monoxide to carbon dioxide in a baking atmosphere is 10-8 or more. In this baking atmosphere, the temperature in the furnace was increased to various temperatures ranging from 300° C. to 500° C., and then baking was performed for 1 minute to 10 minutes. Then results similar to those shown in FIG. 1 were able to be obtained. That is, the resistivity of wiring is about 20 μΩcm in a case where the baking temperature is 300° C. while the resistivity of wiring is 10 μΩcm or less in a case where the baking temperature is 350° C. or more.

Figure 2:
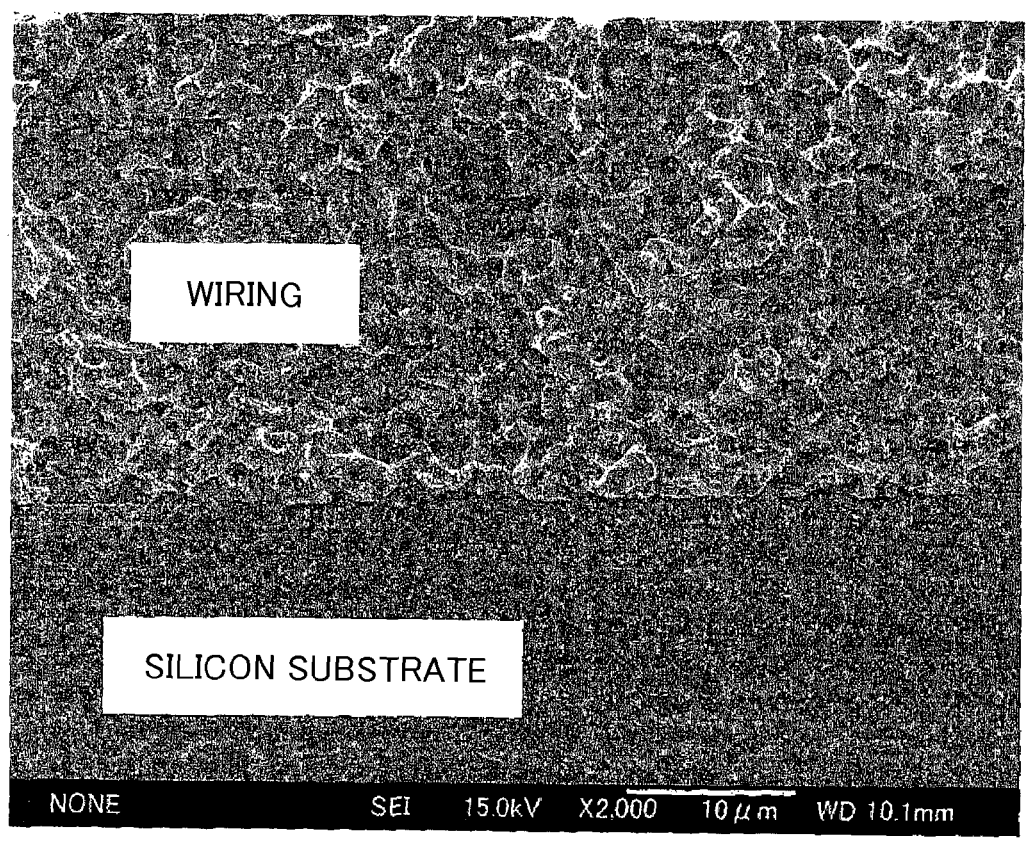
FIG. 2 shows a cross-sectional structure of wiring manufactured by printing a copper paste on a silicon substrate and performing baking at 500° C. for 10 minutes.

FIG. 2 shows a cross-sectional structure of wiring when the nitrogen gas passed through ethyl alcohol, and then was introduced into a furnace to perform baking for 10 minutes at 500° C. Copper particles were sintered, and particles were bonded each other. No resin component was observed in the void. Further, according to the results from composition analysis of this wiring conducted by a high-frequency induction-coupled plasma method, the concentration of metal elements other than copper contained showed no significant difference as compared with that in 99.8% pure raw particles. Further, significant portions of copper particles are flat at the interface with a substrate, showing good contact with the substrate. The substrate of FIG. 2 was silicon, but in other substrates such as an insulating ceramics substrate, an electrically conductive ceramics substrate, a semiconductor substrate, similar structure forms were observed.

EXAMPLE 2

Shown in Table 1 below are the viscosity (η) of a paste as measured at a shearing strain rate of 1 per second at 25° C. and the resistivity (ρ) of wiring after baking when the mean aspect ratio of copper particles was varied under the conditions of Example 1 above. Methods of changing the mean aspect ratio include those in which spray conditions of gas or water and cooling conditions are altered when producing copper particles by the gas atomizing method or the water atomizing method. They also include a method in which particles obtained by the atomizing method (atomized particles) are formed to be flake-like shape by the ball milling method, and the flake-like shaped particles are mixed with the atomized particles, and a method in which rod-like particles produced by the solution depositing method are mixed with the atomized particles. Here, results are shown in a case where the mean aspect ratio was altered by changing spray conditions and cooling conditions in the water atomizing method. Even when flake-like and rod-like particles were mixed, results would not change. From the results obtained, a case where the viscosity was between 150 Pa·s and 350 Pa·s inclusive and the resistivity of wiring was 10 μΩcm or less was determined as good, and others were determined as bad.

TABLE 1

Effect of aspect ratio of copper particles

| Mean aspect ratio | 1.1 | 1.5 | 1.9 | 2.2 | 2.5 |
|---|---|---|---|---|---|
| η(Pa · s) | 260 | 253 | 230 | 150 | 145 |
| ρ(μΩ · cm) | 5 | 6 | 8 | 12 | 13 |
| Results | Good | Good | Good | Bad | Bad |

As shown above, the mean aspect ratio of copper particles should be 1.0 or more and less than 2.2, and preferably between 1.0 and 2.0 inclusive.

EXAMPLE 3

Shown in Table 2 are results from measuring the continuity of printed wiring and the ratio of a length of the base line of wiring to a mask opening width (length of the base line/opening width=L/W) and the resistivity of wiring after baking, when the mean particle diameters (the 50% particle diameter=d50, the 90% particle diameter=d90) of copper particles were varied under the conditions of Example 1. From the obtained results, a case where no disconnection was visually observed in printed wiring, and the L/W was 1.4 or less, and the resistivity of wiring was 10 μΩcm or less was determined as good, and others were determined as bad.

TABLE 2

Effect of mean particle diameter of copper particles

| | d50 (μm) | | | | | | |
|---|---|---|---|---|---|---|---|
| | 0.1 | 0.5 | 1.2 | 1.8 | 2.0 | 3.0 | 3.4 |
| | d90 (μm) | | | | | | |
| | 0.3 | 1.0 | 2.1 | 2.4 | 3.8 | 5.2 | 7.0 |
| Continuity of wiring | Continued | Continued | Continued | Continued | Continued | Continued | Discontinued |
| L/W | 1.63 | 1.44 | 1.04 | 1.06 | 1.12 | 1.35 | 1.52 |
| ρ(μΩ · cm) | 12 | 7 | 4 | 5 | 8 | 9 | 11 |
| Results | Bad | Good | Good | Good | Good | Good | Bad |

As shown above, the 50% particle diameter of copper particles should be more than 0.1 μm and less than 3.4 μm, more preferably between 0.5 μm and 3.0 μm inclusive. Further, the 90% particle diameter should be more than 0.3 μm and less than 7.0 μm, more preferably between 1.5 μm and 6.0 μm inclusive.

EXAMPLE 4

Under the conditions of Example 1, carboxymethyl cellulose was used instead of ethyl cellulose as a binder resin constituting an organic vehicle, and butylcarbitol was used instead of Texanol as a solvent. Further, in order to produce an organic vehicle, carboxymethyl cellulose and butylcarbitol were weighed out such that butylcarbitol is [100-X]% wherein X % (X=0.05 to 17.0) is the mass % of carboxymethyl cellulose in the organic vehicle, and then mixed and stirred in a glass vessel. The organic vehicle prepared in this way and copper particles were weighed out to give a mass % of 12% and 88%, respectively, and kneaded with a planetary mixer to obtain a copper paste. This copper paste was printed and baked under the conditions described in Example 1 to obtain wiring. Shown in Table 3 below are the viscosity (η) of a paste as measured at a shearing strain rate of 1 per second at 25° C. and the resistivity (ρ) of wiring after baking when the amount of a resin contained in the organic vehicle was varied in this way. From the obtained results, a case where the viscosity was between 150 Pa·s and 350 Pa·s inclusive, and the resistivity of wiring was 10 μΩcm or less was determined as good, and others were determined as bad.

TABLE 3

Effect of the amount of binder resin contained in organic vehicle

| | Concentration of binder resin X % | | | | | | |
|---|---|---|---|---|---|---|---|
| | 0.05 | 0.1 | 1.0 | 5.0 | 9.0 | 13.0 | 17.0 |
| η(Pa · s) | 120 | 155 | 182 | 234 | 2.55 | 3.30 | 3.0 |
| ρ(μΩ · cm) | 3.0 | 3.1 | 3.5 | 4.5 | 6.3 | 8.4 | 12.5 |
| Results | Bad | Good | Good | Good | Good | Good | Bad |

As shown above, the concentration of a binder resin in an organic vehicle should be more than 0.05% and less than 17.0% by mass %, and preferably between 0.1% and 13.0% inclusive.

EXAMPLE 5

Under the conditions of Example 1, methyl cellulose was used instead of ethyl cellulose as a binder resin constituting an organic vehicle, and terpineol was used instead of Texanol as a solvent. Further, in order to produce an organic vehicle, methyl cellulose and terpineol were weighed out to give 5% and 95% by mass %, respectively, and mixed and stirred in a glass vessel. A copper paste was produced using X % (X=3.0 to 22) by mass % of the organic vehicle and [100-X] % of copper particles. This copper paste was printed and baked under the conditions described in Example 1 to obtain wiring. Shown in Table 4 below are the viscosity (η) of a paste as measured at a shearing strain rate of 1 per second at 25° C. and the resistivity (ρ) of wiring after baking when the amount of a resin contained in the organic vehicle was varied in this way. From the obtained results, a case where the viscosity was between 150 Pa·s and 350 Pa·s inclusive, and the resistivity of wiring was 10 μΩcm or less was determined as good, and others were determined as bad.

TABLE 4

Effect of the amount of organic vehicle

| | Concentration of organic vehicle X % | | | | | | |
|---|---|---|---|---|---|---|---|
| | 3.0 | 5.0 | 10.0 | 13.0 | 18.0 | 19.0 | 22.0 |
| η(Pa · s) | 406 | 314 | 273 | 257 | 195 | 134 | 122 |
| ρ(μΩ · cm) | 8.0 | 7.3 | 4.2 | 3.3 | 6.8 | 9.7 | 13.4 |
| Results | Bad | Good | Good | Good | Good | Bad | Bad |

As shown above, the mass % of an organic vehicle contained in a copper paste should be more than 3.0% and less than 19.0%, and preferably between 5.0% and 18.0% inclusive.

EXAMPLE 6

A copper paste containing glass frit was produced as follows. The copper particles used were the same as those described above in Example 1. For glass frit, lead glass and lead free glass may be used described in, for example, Japanese Patent No. 3050064, Japanese Unexamined Patent Application, Publication No. 2006-313744, Japanese Unexamined Patent Application, Publication No. 2009-188281. Lead glass was used herein. The mass ratio of lead glass was 1.5% relative to the mass of copper particles. The organic vehicle described above in Example 1 in an amount of 14% by mass %, and the copper particles and the glass frit in an amount of 86% in total were kneaded with a planetary mixer. Further, in order to achieve uniform dispersion of the copper particles and the glass frit, kneading was performed with a 3-roll mill. Using an automatic screen printer, the obtained electrically conductive paste was printed on an insulating alumina substrate, an insulating aluminum nitride substrate, a silicon substrate in which silicon nitride had been deposited on a surface thereof by the chemical vapor deposition method. Then, good printing property similar to the above Example 1 was able to be achieved for any of the substrates.

Next, a sample in which the electrically conductive paste was printed on an insulating alumina substrate and an insulating aluminum nitride substrate was placed in a baking furnace, and evacuation of air was performed until the pressure in the furnace reached $10^{-5}$ Pa or less. Subsequently, heating was performed for 5 minutes at 150° C. to dry the paste. Then, the temperature of the furnace was increased to 850° C., and oxygen gas was introduced from an oxygen cylinder to adjust the pressure in the furnace to $5 \times 10^{-4}$ Pa, and this condition was maintained for 2 minutes. The electric resistivity of the sample cooled to room temperature was 4 μΩcm as measured by a direct-current four probe method. Further, even when scratching wiring with a metal rod having a sharp tip, no detachment from the substrate was observed.

EXAMPLE 7

A silicon solar cell having copper wiring formed by screen printing of a copper paste was produced as follows. Here, a p/n junction cell in which phosphorus (P) is diffused on the upper part of a p-type silicon substrate to form an n-type region is used as an example for the explanation. It is assumed that processes other than wiring formation have completed such as the formation of texture, passivation, antireflective coating (ARC) on the surface of the front photoreceptor side, and the formation of a back surface field (BSF) of aluminum on the back side.

A portion of ARC formed on the surface of the photoreceptor side of the aforementioned p/n junction cell is removed using a femtosecond laser. After forming nickel on the removed portion by the electroless plating method, a nickel silicide is formed by heating in the range from 300° C. to 400° C. under vacuum or under an inert gas. This nickel silicide is necessary in order to obtain ohmic contact with silicon and to prevent interdiffusion of copper and silicon.

Copper was screen printed on the nickel silicide using any of the copper pastes shown in Examples above. Then, baking was performed by the method shown in Example above to obtain silicon solar cells having copper wiring. The mean crystal grain diameter of the obtained copper wirings was between 0.5 μnm and 3 μm inclusive. Further, the total amount of metal elements other than copper contained in copper wiring was 0.2 mass % or less.

The conversion efficiency of the silicon solar cells having copper wiring obtained in this way was improved by 2% or more as compared with a silicon solar cell having silver wiring.

EXAMPLE 8

The copper paste according to the present invention is also applicable to an HIT (Heterojunction with Intrinsic Thin layer) type solar cell having a transparent electrically conductive oxide films (TCO) on the both sides of the cell. There are many TCOs including indium tin oxides (ITO), tin oxides ($SnO_{1-x}$), zinc oxides ($ZnO_{1-x}$), aluminum added zinc oxides (AZO) and the like. Here, AZO is used as an example for the explanation. Amorphous p-type layers, intrinsic layers, n-type layers formed on the both sides of an n-type silicon and an AZO formed on the outermost surface are prepared according to a conventional method.

Copper was screen printed on AZO using any of the copper pastes shown in the Examples above. Then, baking was performed by the method shown in the Examples above to obtain a HIT type silicon solar cell having copper wiring. The mean crystal grain diameter of the obtained copper wiring was between 0.5 μm and 3 μm inclusive. Further, the total amount of metal elements other than copper contained in the copper wiring was 0.2 mass % or less.

The conversion efficiency of the silicon solar cells having copper wiring obtained in this way was improved by 2% or more as compared with a silicon solar cell having silver wiring.

The invention claimed is:

1. An electrically conductive paste consisting of metal particles, and an organic vehicle comprising a binder resin, wherein a mean value of aspect ratio defined as a ratio of a maximum diameter to a minimum diameter of the metal particles is equal to or larger than 1.0 and smaller than 2.2 wherein:
   a 90% particle diameter of the metal particles is more than 0.3 μm and less than 7.0 μm;
   a 50% particle diameter of the metal particles is more than 0.1 μm and less than 3.4 μm;
   wherein the metal particles consists of copper and oxygen, wherein a concentration of oxygen contained in the metal particles is 0.05 mass % or more and 2.0 mass % or less;
   a mass % of the organic vehicle contained in the electrically conductive paste is 3.0% or more and 19.0% or less, and
   the binder resin is a resin which is decomposable by baking, and a mass % of the binder resin in the organic vehicle contained in the electrically conductive paste is 0.05% or more and 17.0% or less.

2. A method of forming wiring, comprising printing an electrically conductive paste on a substrate and performing baking,
   wherein the electrically conductive paste according to claim 1 is used as the electrically conductive paste, and
   the baking is performed under a baking atmosphere of an inert gas or vacuum and under an oxygen partial pressure of $10^{-3}$ Pa or less in the baking atmosphere.

3. A method of forming wiring, comprising printing an electrically conductive paste on a substrate and performing baking,
wherein the electrically conductive paste according to claim 1 is used as the electrically conductive paste, and the baking is performed under a baking atmosphere of an inert gas or vacuum and under a pressure ratio (CO/CO$_2$) of carbon monoxide to carbon dioxide of 10$^{-8}$ or more in the baking atmosphere.

4. The method of forming wiring according to claim 2, wherein the inert gas is nitrogen gas or argon gas, and contains 3500 ppm or less of oxygen, the inert gas passing through liquid alcohol before introduced into a baking furnace.

5. The method of forming wiring according to claim 2, wherein the baking is performed at a baking temperature of between 200° C. and 850° C. inclusive for a baking duration of between 1 minute and 60 minutes inclusive.

6. The method of forming wiring according to claim 2, wherein the baking is performed at a baking temperature of between 300° C. and 500° C. inclusive for a baking duration of between 1 minute and 7 minutes inclusive, and the inert gas is introduced into a baking furnace without passing through liquid alcohol.

7. An electrically conductive paste consisting of metal particles, and an organic vehicle comprising a binder resin, wherein a mean value of aspect ratio defined as a ratio of a maximum diameter to a minimum diameter of the metal particles is equal to or larger than 1.0 and smaller than 2.2, wherein:
a 90% particle diameter of the metal particles is more than 0.3 pm and less than 7.0 pm;
a 50% particle diameter of the metal particles is more than 0.1 pm and less than 3.4 pm;
the metal particles consist of copper (Cu) oxygen and one or more other metal element selected from the group consisting of manganese (Mn), silicon (Si), boron (B), titanium (Ti), cerium (Ce), magnesium (Mg), and calcium (Ca);
wherein a concentration of oxygen contained in the metal particles is 0.05 mass % or more and 2.0 mass % or less;
a total concentration of the one or more other metal element is 0.5 mass % or less of the total metal particles;
a mass % of the organic vehicle contained in the electrically conductive paste is 3.0% or more and 19.0% or less, and
the binder resin is a resin which is decomposable by baking, and a mass % of the binder resin in the organic vehicle contained in the electrically conductive paste is 0.05% or more and 17.0% or less.

8. An electrically conductive paste consisting of metal particles, and an organic vehicle comprising a binder resin, wherein a mean value of aspect ratio defined as a ratio of a maximum diameter to a minimum diameter of the metal particles is equal to or larger than 1.0 and smaller than 2.2, wherein:
a 90% particle diameter of the metal particles is more than 0.3 pm and less than 7.0 pm; a 50% particle diameter of the metal particles is more than 0.1 pm and less than 3.4 pm;
the metal particles consist of copper (Cu) oxygen and one or more other metal element selected from the group consisting of bismuth (Bi), cobalt (Co), chromium (Cr), iron (Fe), molybdenum (Mo), niobium (Nb), lead (Pb), ruthenium (Ru), tantalum (Ta), tungsten (W), and vanadium (V);
a concentration of oxygen contained in the metal particles is 0.05 mass % or more and 2.0 mass % or less;
a total concentration of the one or more other metal element is 0.5 mass % or less of the total metal particles,
a mass % of the organic vehicle contained in the electrically conductive paste is 3.0% or more and 19.0% or less, and
the binder resin is a resin which is decomposable by baking, and a mass % of the binder resin in the organic vehicle contained in the electrically conductive paste is 0.05% or more and 17.0% or less.

9. An electrically conductive paste consisting of metal particles, and an organic vehicle comprising a binder resin, wherein a mean value of aspect ratio defined as a ratio of a maximum diameter to a minimum diameter of the metal particles is equal to or larger than 1.0 and smaller than 2.2, wherein:
a 90% particle diameter of the metal particles is more than 0.3 pm and less than 7.0 pm;
a 50% particle diameter of the metal particles is more than 0.1 pm and less than 3.4 pm;
the metal particles consist of copper (Cu), oxygen, and one or more first metal element selected from the group consisting of manganese (Mn), silicon (Si), boron (B), titanium (Ti), cerium (Ce), magnesium (Mg), and calcium (Ca), and
one or more second metal element selected from the group consisting of bismuth (Bi), cobalt (Co), chromium (Cr), iron (Fe), molybdenum (Mo), niobium (Nb), lead (Pb), ruthenium (Ru), tantalum (Ta), tungsten (W), and vanadium (V);
a concentration of oxygen contained in the metal particles is 0.05 mass % or more and 2.0 mass % or less;
a total concentration of the first metal element is 0.5 mass % or less of the total metal particles;
a total concentration of the second metal element is 0.5 mass % or less of the total metal particles;
a mass % of the organic vehicle contained in the electrically conductive paste is 3.0% or more and 19.0% or less, and
the binder resin is a resin which is decomposable by baking, and a mass % of the binder resin in the organic vehicle contained in the electrically conductive paste is 0.05% or more and 17.0% or less.

* * * * *